US010629966B2

(12) United States Patent
Biswas et al.

(10) Patent No.: US 10,629,966 B2
(45) Date of Patent: Apr. 21, 2020

(54) MODULAR, ADAPTABLE HOLDERS FOR SENSORS AND BATTERY CELLS FOR PHYSICAL ANALYSIS

(71) Applicant: Feasible, Inc., Emeryville, CA (US)

(72) Inventors: Shaurjo Biswas, El Cerrito, CA (US); Robert Charles Mohr, Berkeley, CA (US); Andrew Gaheem Hsieh, Berkeley, CA (US); Barry James Van Tassell, El Cerrito, CA (US); Daniel Artemis Steingart, Princeton, NJ (US); Jonathan Ajo-Franklin, Berkeley, CA (US)

(73) Assignees: FEASIBLE, INC., Emeryville, CA (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 227 days.

(21) Appl. No.: 15/717,293

(22) Filed: Sep. 27, 2017

(65) Prior Publication Data
US 2018/0123189 A1 May 3, 2018

Related U.S. Application Data

(60) Provisional application No. 62/416,497, filed on Nov. 2, 2016.

(51) Int. Cl.
*H01M 10/48* (2006.01)
*H01M 6/50* (2006.01)
(Continued)

(52) U.S. Cl.
CPC ........ *H01M 10/486* (2013.01); *G01N 29/223* (2013.01); *G01N 29/2462* (2013.01);
(Continued)

(58) Field of Classification Search
CPC .. G01N 29/2462; G01N 29/28; G01N 29/223; G01N 2291/048; G01N 2291/106;
(Continued)

(56) References Cited

U.S. PATENT DOCUMENTS 10,014,561 B2 * 7/2018 Sood ................... B60L 58/16
2008/0028860 A1   2/2008 Refko et al.
(Continued)

FOREIGN PATENT DOCUMENTS

| CN | 205050958 U | 2/2016 |
| WO | 2015023820 A2 | 2/2015 |

OTHER PUBLICATIONS

International Search Report and Written Opinion dated Feb. 6, 2018 in International Application No. PCT/US2017/059652.
(Continued)

*Primary Examiner* — Jacques M Saint Surin
(74) *Attorney, Agent, or Firm* — Polsinelli

(57) ABSTRACT

Systems and methods for battery testing including a holder system. The holder system is designed to couple one or more transducers to a battery under test, wherein the one or more transducers are configured for electrochemical-acoustic signal interrogation (EASI) of the battery. The holder system includes at least one arm to house at least one transducer to be coupled to the battery, and a pressure applying device to apply pressure to the at least one transducer, and to control pressure between the at least one transducer and the battery. The holder system is also configured to determine the pressure between the at least one transducer and the battery and adjust the pressure applied to the at least one transducer based on the determined pressure.

32 Claims, 11 Drawing Sheets

(51) Int. Cl.
*G01N 29/24* (2006.01)
*G01N 29/28* (2006.01)
*G01N 29/22* (2006.01)
*H01M 2/10* (2006.01)
*H01M 10/42* (2006.01)

(52) U.S. Cl.
CPC .......... *G01N 29/28* (2013.01); *H01M 2/1016* (2013.01); *H01M 6/5044* (2013.01); *H01M 10/4257* (2013.01); *H01M 10/4285* (2013.01); *H01M 10/48* (2013.01); *G01N 2291/02863* (2013.01); *G01N 2291/048* (2013.01); *G01N 2291/106* (2013.01); *G01N 2291/2634* (2013.01); *H01M 6/5083* (2013.01); *H01M 10/482* (2013.01)

(58) Field of Classification Search
CPC ............ G01N 2291/2634; G01N 2291/02863; H01M 2/1016; H01M 10/4257; H01M 10/4285; H01M 10/486; H01M 10/48; H01M 6/5044; H01M 10/482; H01M 6/5083
USPC .......................................................... 73/632
See application file for complete search history.

(56) References Cited

U.S. PATENT DOCUMENTS

| 2010/0238027 | A1* | 9/2010 | Bastianini | G01D 9/005 340/540 |
|---|---|---|---|---|
| 2013/0091950 | A1* | 4/2013 | Bernard | G01N 29/14 73/587 |
| 2013/0335094 | A1 | 12/2013 | Adams et al. | |
| 2014/0255738 | A1 | 9/2014 | Adams et al. | |
| 2016/0197382 | A1 | 7/2016 | Sood et al. | |
| 2018/0120261 | A1* | 5/2018 | Hsieh | B60L 58/10 |
| 2019/0072614 | A1* | 3/2019 | Steingart | G01R 31/385 |

OTHER PUBLICATIONS

Sood, Bhanu et al., "Health Monitoring of Lithium-ion Batteries", IEEE, Center for Advanced Life Cycle Engineering, Department of Mechanical Engineering, University of Maryland, College Park, MD, 2013, pp. 1-6.

Sood, Bhanu et al., "Health Monitoring of Lithium-Ion Batteries", ISTFA 2013 special Late-Breaking News session, vol. 16, No. 2, pp. 1-14.

Pham, Huan Le, "Health Diagnosis of Lithium-ion Battery Cell Using Vibration-based Test and Analysis", Purdue University, Open Access Theses, 2013, pp. 1-86.

Gold, Lukas et al., "Probing lithium-ion batteries' state-of-charge using ultrasonic transmission—Concept and aboratory testing". Journal of Power Sources 343 (2017) pp. 536-544.

Ladpli, Purim et al., "Design of Multifunctional Structural Batteries with Health Monitoring Capabilities", 8th European Workshop on Structural Health Monitoring (EWSHM 2016), Jul. 5-8, 2016, Spain, Bilbao, www.ndt.net/app. EWSHM2016.

Chou, Yi-Sin et al., "A novel ultrasonic velocity sensing approach to monitoring state of charge of vanadium redox flow battery", Applied Energy 182 (2016) pp. 253-259.

Ladpli, Purim et al., "Battery charge and health state monitoring via ultrasonic guided-wave-based methods using built-in piezoelectric transducers", Smart Materials and Nondestructive Evaluation for Energy Systems 2017, Proc. of SPIE vol. 10171 1017108-1, pp. 1-12.

Ladpli, Purim et al., "Design of Multifunctional Structural Batteries with Health Monitoring Capabilities", ResearchGate, Conference Paper, Jul. 2016, pp. 1-14, 8th European Workshop On Structural Health Monitoring (EWSHM 2016), Jul. 5-8, 2016, www.ndt.net/app.EWSHM2016.

* cited by examiner

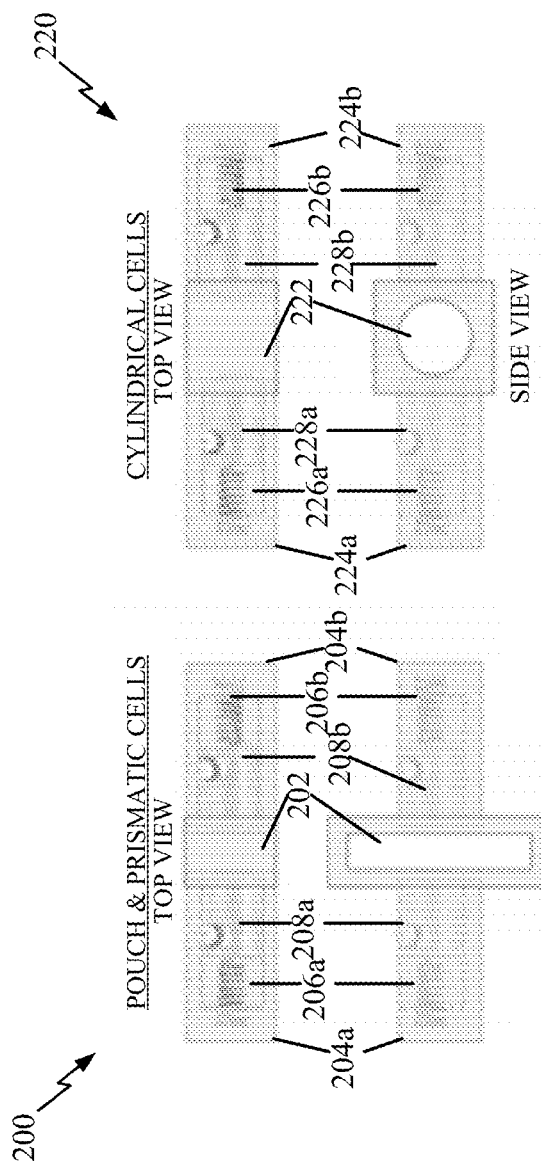

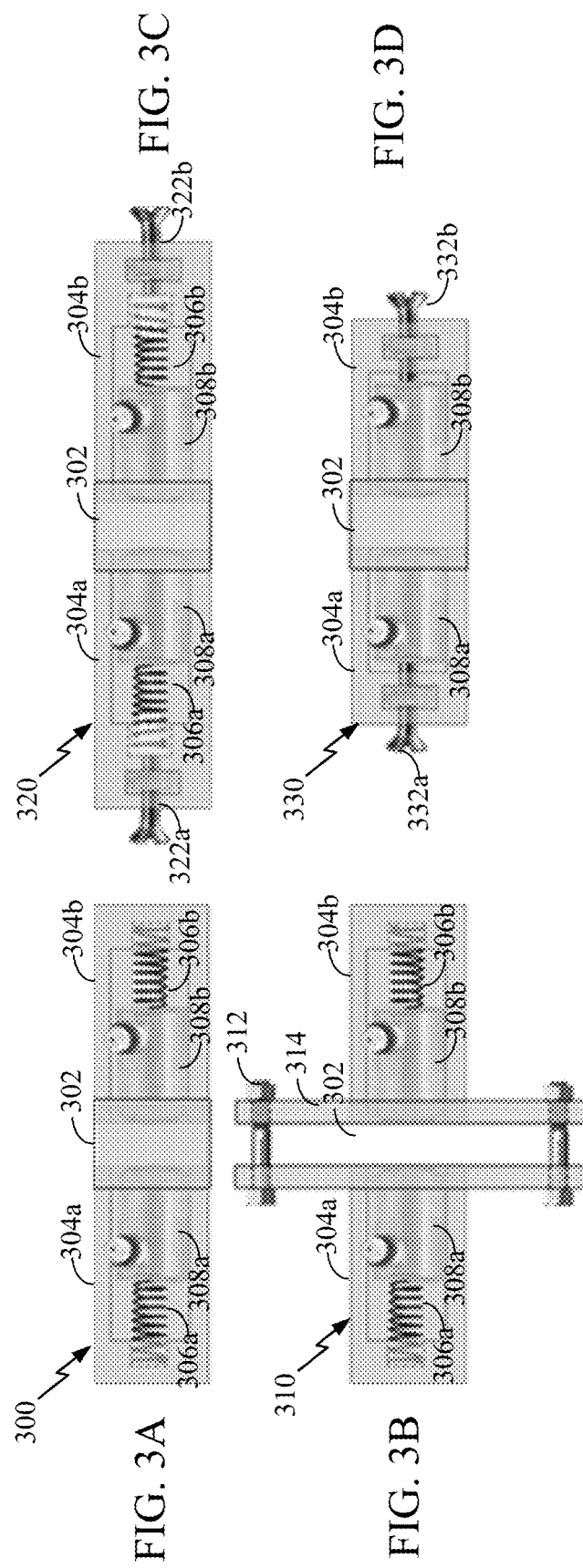

MODULAR, ADAPTABLE HOLDERS FOR SENSORS AND BATTERY CELLS FOR PHYSICAL ANALYSIS

CROSS-REFERENCE TO RELATED APPLICATIONS

The present Application for Patent claims the benefit of Provisional Patent Application No. 62/416,497 entitled "MODULAR, ADAPTABLE HOLDERS FOR SENSORS AND BATTERY CELLS FOR PHYSICAL ANALYSIS" filed Nov. 2, 2016, and assigned to the assignee hereof and hereby expressly incorporated herein by reference in its entirety.

STATEMENT REGARDING FEDERALLY SPONSORED RESEARCH OR DEVELOPMENT

This invention was made with U.S. Federal Government support under Grant No. SBIR 1621926 awarded by the National Science Foundation. The U.S. Federal Government has certain rights in the invention.

FIELD OF DISCLOSURE

Disclosed aspects are directed to battery diagnostics. More specifically, exemplary aspects are directed to modular, adaptable holders configured to accommodate one or more types of sensors for use in physical analysis of one or more types and/or shapes of batteries.

BACKGROUND

The battery industry currently lacks techniques which have attributes of being scalable, consistent, non-destructive, stand-alone, etc., for detecting physical characteristics and changes thereof in a battery during manufacturing or in use. Some conventional techniques for battery diagnostics involve measuring physical characteristics of batteries such as temperature, internal pressure, stress-strain, open circuit voltage, direct current (DC) impedance, alternating current (AC) impedance, and current-voltage characteristics.

Information gathered about a battery using the above techniques can be used to infer different aspects of the overall condition of the battery. For example, an increase in temperature in a Lithium-ion (Li-ion) battery during charge-discharge cycling of the Li-ion battery can indicate the charge-discharge rate or power output of the Li-ion battery. Alternatively, the increase in temperature can indicate potential formation of internal short circuits or breakdown of electrolytes in the Li-ion battery. In another example, a strain gauge placed at a surface of a pouch cell type battery can be used to detect a buildup of pressure within the pouch cell (e.g., due to formation of gas within the pouch cell); or to detect a degradation state of electrodes within the pouch cell.

Electrochemical-acoustic signal interrogation (EASI) is another diagnostic technique that uses ultrasound signals to measure changes in the physical properties of batteries. EASI operates on the principle that the acoustic behavior of a battery is sensitive to any change in physical properties along a path traveled by sound waves of the ultrasound signals. Accordingly, EASI may be used to directly and actively probe internal components of the battery (wherein, it will be recognized that electrical, thermal, and strain-based diagnostic techniques are not capable of such probing as is made possible by EASI). In addition, EASI is also agnostic to chemistries or geometries of batteries. EASI may also be implemented with minimal hardware, such as a pair of transducers in direct contact with the body of the battery.

With reference to FIG. 1, a schematic of system 100 comprising example hardware for EASI is shown. System 100 comprises battery 102, to which a pair of transducers 108a-b may be affixed on two locations (e.g., on opposite sides) on the surface of battery 102. Hardware such as screws 106a-b are shown, but other alternative means for affixing transducers 108a-b to the body of battery 102 may be used. Battery cycler 110 represents a controller for charging-discharging battery 102 and may be connected to battery 102 through terminals 104a-b of battery 102. Ultrasonic pulser/receiver 112 is coupled to transducers 108a-b, wherein through the control of one of ultrasonic pulser/receiver 112, one of transducers 108a-b is configured to transmit ultrasonic signals while the other one of transducers 108a-b is configured to receive the transmitted ultrasonic signals. A computer (not separately shown) which may be provided within or coupled to the block identified as ultrasonic pulser/receiver 112 may be configured to analyze the received ultrasonic signals and infer the characteristics of battery 102 according to EASI techniques.

Although a wide variety of physical sensors may be employed by a EASI system such as system 100, it is observed that a single sensor type may not be able to detect all aspects of the physical characteristics and changes thereof that may determine a battery's condition. Hence, some battery diagnostic approaches may employ two or more measurement techniques using different sensor types to obtain a more complete picture of the condition of the batteries, especially while the batteries are in use. However, with the exception of electrical testing methods, in which the electrical leads are connected to the tabs of the batteries there is no standard method in the art for maintaining physical contact between the measurement sensors, particularly EASI sensors such as transducers 108a-b and the surface of the battery's body.

There is accordingly a need for modular, adaptable holders that can be used for different types of batteries (e.g., cylindrical batteries, pouch type cells, etc.) which are compatible with and can accommodate multiple types of measurement sensors.

SUMMARY

Exemplary aspects of this disclosure are directed to systems and methods for battery testing. A holder system is designed to couple one or more transducers to a battery under test, wherein the one or more transducers are configured for electrochemical-acoustic signal interrogation (EASI) of the battery. The holder system includes at least one arm to house at least one transducer to be coupled to the battery, and a pressure applying device to apply pressure to the at least one transducer, and to control pressure between the at least one transducer and the battery. The holder system is also configured to determine the pressure between the at least one transducer and the battery and adjust the pressure applied to the at least one transducer based on the determined pressure.

For example, an exemplary aspect is directed to an apparatus comprising a holder system. The holder system is configured to couple one or more transducers to a battery, the one or more transducers configured for electrochemical-acoustic signal interrogation (EASI) of the battery. The holder system comprises at least one arm configured to house at least one transducer to be coupled to the battery, and a pressure applying device configured to apply pressure to the at least one transducer, to control pressure between the at least one transducer and the battery.

Another exemplary aspect is directed to a method of testing a battery. The method comprises coupling one or more transducers to the battery, the one or more transducers configured for electrochemical-acoustic signal interrogation (EASI) of the battery and coupling the at least one arm to the battery, wherein at least one transducer is housed in the at least one arm. The method further comprises applying pressure to the at least one transducer, to control pressure between the at least one transducer and the battery.

Yet another exemplary aspect is directed to a battery holder system comprising means for housing at least one transducer to be coupled to a battery under test, the at least one transducers configured for electrochemical-acoustic signal interrogation (EASI) of the battery, and means for applying pressure to the at least one transducer for controlling pressure between the at least one transducer and the battery.

BRIEF DESCRIPTION OF THE DRAWINGS

The accompanying drawings are presented to aid in the description of various aspects of the invention and are provided solely for illustration and not limitation.

FIGS. 2A-D illustrate example holder systems for EASI of batteries according to exemplary aspects of this disclosure.

FIGS. 3A-E illustrate example mechanisms for applying and adjusting pressure between transducers and batteries under test, according to aspects of this disclosure.

DETAILED DESCRIPTION

Figure 1:
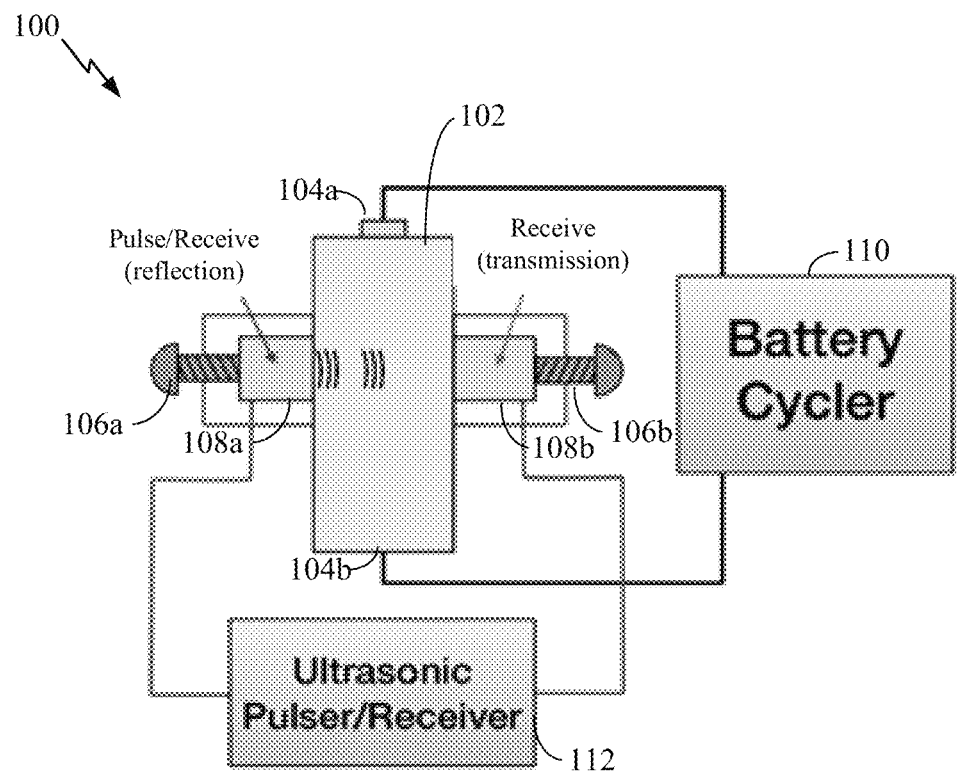
FIG. 1 is a schematic that illustrates example hardware for EASI.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Exemplary aspects of this disclosure are directed to holders configured to enable attachment of one or more sensors, which may be of different types, to batteries of different types and/or geometries, the one or more sensors for aiding diagnostics of the batteries. It will be understood that references to "batteries" in this disclosure do not assume any inherent limitation as to any specific type of battery or cell but are generally meant to cover any type of electrochemical energy storage device.

With reference to FIGS. 2A-D, schematic views of exemplary holder systems 200, 220, 240, and 260 are illustrated therein. Holder systems 200, 220, 240, and 260 generally comprise one or more sensors, or more generally, one or more transducer units configured to be mechanically coupled (e.g., affixed or attached) to different types of batteries which may be of different geometries.

For example, starting with FIG. 2A, top and side views of holder system 200 are shown. Holder system 200 comprises battery 202, which may be a pouch/prismatic cell. Two representative portions of holder system 200, generally referred to as "arms" are shown and designated with reference numerals 204a-b. Arms 204a-b may be movable and configured to establish contact with various surfaces of battery 202. Arms 204a-b comprise transducers 208a-b, respectively, wherein each one of transducers 208a-b is configured to transmit and/or receive acoustic signals such as ultrasonic sound signals into/from battery 202. Although two transducers 208a-b are illustrated, wherein one of the two transducers 208a-b may be configured to transmit the acoustic signals and the other one of the two transducers 208a-b may be configured to receive the transmitted, signals, it will be understood that a single transducer may also be configured to both transmit and receive (e.g., reflected signals) for the purposes of physical analysis of battery 202.

Although not explicitly shown, there may be various control mechanisms for directing transducers 208a-b, processing mechanisms for analyzing the acoustic signals for diagnosing battery 202, etc., configured to cooperate with holder system 200. In one aspect, arms 204a-b may be configured to place transducers 208a-b coaxially on opposite sides of battery 202. Transducers 208a-b need not be aligned to maintain any type of symmetry (e.g., in a transverse direction in either the top view or the side view), and their respective alignment may be based on the type of analysis desired. Arms 204a-b of holder system 200 may also comprise slots to accommodate battery 202 of different geometries, and correspondingly, slots for transducers 208a-b to be aligned at a desired angle with respect to, e.g., perpendicular to, the surface of battery 202. As previously mentioned, arms 204a-b may be individually and independently moveable for obtaining acoustic signal based analysis (e.g., EASI) at different positions along the surface of battery 202. The movement, alignment, and/or actuation of arms 204a-b may be achieved by robotic or computer-controlled mechanisms in exemplary aspects.

It is recognized that the pressure applied to transducers 208a-b at their area of contact with battery 202 may affect the measurements of signals transmitted/received through battery 202. Therefore, it is desirable to control the pressure applied to the one or more transducers such as 208a-b. Accordingly, in one aspect, a pressure applying device or means for applying pressure, such as, springs, pneumatic pressure mechanisms, lead screws, linear actuators, electromagnetic solenoids, linear motor actuators, hydraulic mechanisms, etc., for applying and maintaining consistent and preferably adjustable pressure may be provided in arms 204a-b, respectively. FIG. 2A illustrates an exemplary aspect wherein such means for applying pressure include springs 206a-b, while FIG. 2D illustrates other means for applying pressure. As shown, springs 206a-b may be configured to apply pressure on transducers 208a-b to control their mechanical coupling to the surface of battery 202 (wherein in the illustrated example, each of transducers 208a-b is shown as being disposed in between respective one of springs 206a-b and battery 202). Using springs 206a-b configured as identical precision compression springs, for example, equal stack pressure may be applied to both transducers 208a-b. By adjusting spring compression distance with spring stiffness for springs 206a-b, the pressure at the interfaces between transducers 208a-b and respective surfaces of battery 202, can be adjusted, e.g., tuned from 1 to 10 pounds per square inch (psi) (while other actuation methods, e.g., as will be further described with reference to FIG. 2D may be used to control the pressure from 1 to 50 psi or more).

FIG. 2B shows top and side views of holder system 220, which may be similar in some aspects to holder system 200 described above. Accordingly, like components of holder system 220 may be configured in similar fashion as holder system 200 of FIG. 2A and a repetition of the description of like components will be avoided for the sake of brevity. Notably, holder system 220 may be configured to mechanically or physically couple arms 224a-b comprising transducers 228a-b to battery 222 for the purposes of physical analysis of battery 222, e.g., using EASI. Battery 222 may be a cylindrical cell and arms 224a-b may be correspondingly configured to accommodate the cylindrical geometry of battery 222. Arms 224a-b may also comprise means for applying pressure such as springs 226a-b coupled to transducers 228a-b, respectively.

Figure 2C:
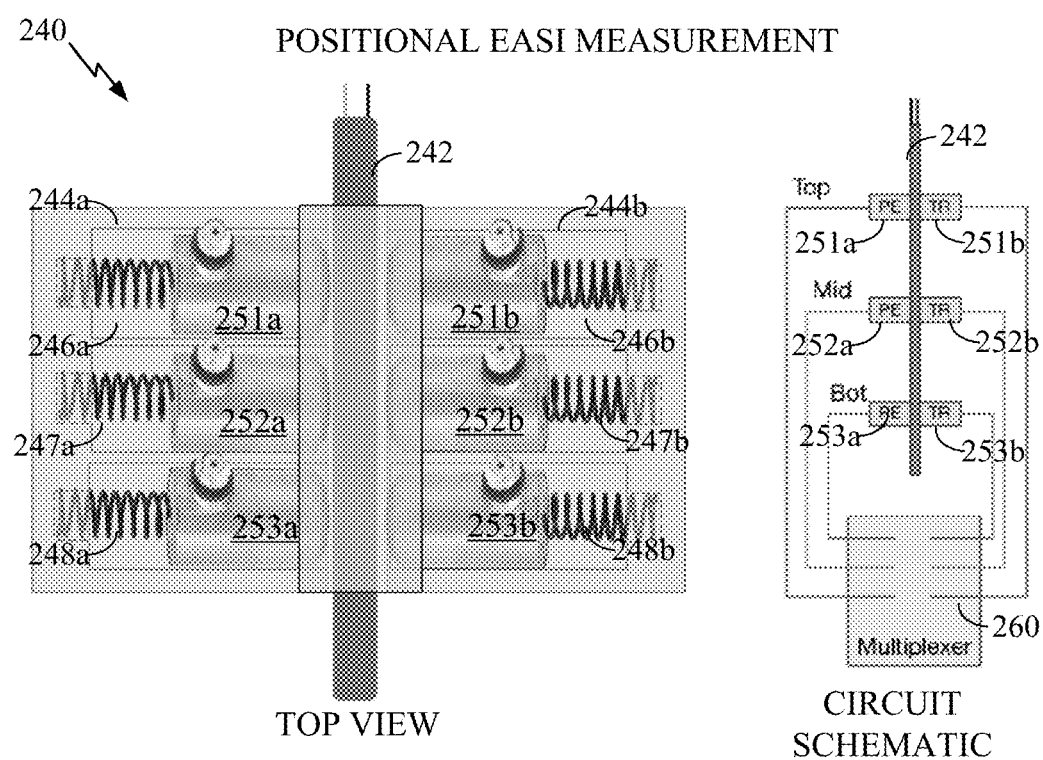
Figure 2D:
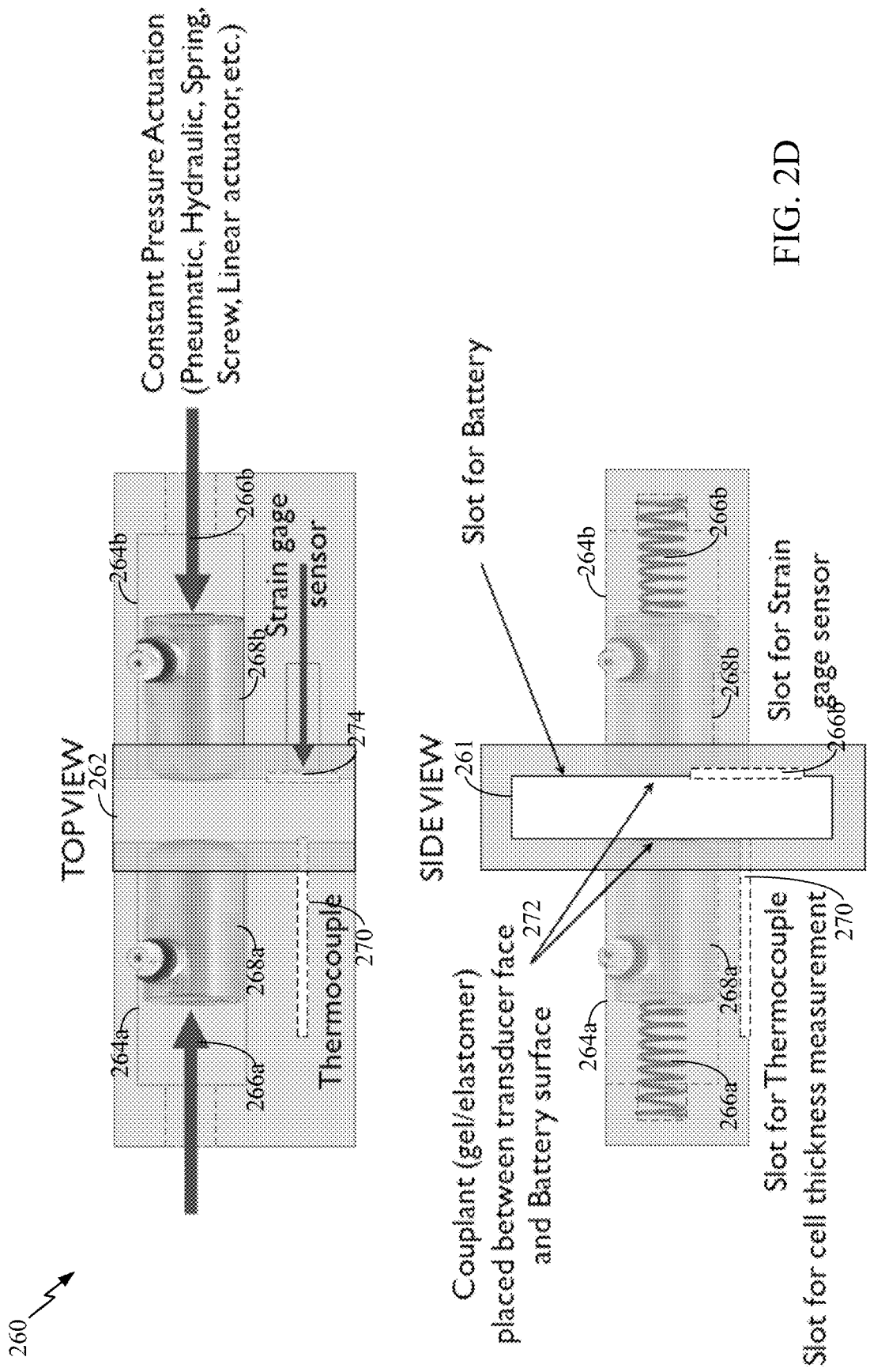

FIG. 2C shows another exemplary holder system 240 configured to accommodate more than two transducer units for use in EASI, for example. Specifically shown in the top view are arms 244a-b configured to enable mechanical coupling of transducers for EASI of battery 242. Each of arms 244a-b are shown to comprise multiple transducers. Arm 244a, for example, is shown to comprise transducers 251a, 252a, and 253a; and arm 244b is shown to comprise transducers 251b, 252b, and 253b. Corresponding means for applying pressure to each of these transducers 251-b, 252a-b, and 253a-b are shown as respective springs 246a-b, 247a-b, and 248a-b. Although three transducer units are shown to be housed in each arm (e.g., 251a, 252a, and 253a in arm 244a), these transducer units may be individually and independently moveable, either within their respective arm or they may be housed in separate arms in alternative deployments. Furthermore, the pressures of each transducer unit may be individually controllable (e.g., using springs 246a, 247a, and 248a for transducers 251a, 252a, and 253a, respectively).

FIG. 2C also shows a circuit schematic corresponding to the top view of holder system 240 discussed above. In an example, transducers 251a, 252a, and 253a of arm 244a may be configured to transmit acoustic signals and transducers 251b, 252b, and 253b of arm 244b may be configured to receive the transmitted acoustic signals (keeping in mind that each one of transducers 251b, 252b, and 253b may be configured to receive acoustic signals transmitted from any one or more transducers 251a, 252a, and 253a). Wires or interconnects from transducers 251a-b, 252a-b, and 253a-b may be electrically coupled to multiplexor 260, which may, in conjunction with a control block and/or processing element be configured to analyze the transmitted and received signals, e.g., for EASI of battery 242.

Furthermore, it is possible to achieve a high quality mechanical contact between the above-described transducers and the surface of battery by the use of acoustic couplants such as, but not limited to, polymer gel, silicone oil, rubber pads, elastomers, epoxy, glycerin, and propylene glycol, among others. Exemplary battery holders can also be designed to accommodate holders (e.g., 3D-printed) for strain gauges or other sensors of humidity, chemical species, etc., as well as for components such as thermocouples, or pressure sensors, or for any combination of sensors.

For example, with reference to FIG. 2D, top and side views of holder system 260 are shown with example illustrations for couplants, slots for sensors and slots for thermocouples. In more detail, FIG. 2D shows holder system 260 comprising battery 262 (which may be placed or housed in slot 261, shown in the side view) and arms 264a-b comprising transducers 268a-b for EASI measurements of battery 262. Further, means 266a-b for applying pressure to respective transducers 268a-b are shown as any means for constant pressure actuation, e.g., pneumatic, hydraulic, spring, screw, linear actuator, etc. In the side view, an example wherein means 266a-b comprises springs 266a-b, similar to holder systems previously described is shown.

Couplants 272 as shown in the side view may be placed in interfaces between battery 262 and transducers 268a-b to achieve a high quality mechanical contact between faces of the above-described transducers 268a-b and the surface of battery 262. Couplants 272 may be formed, for example, from polymer gel, silicone oil, rubber pads, elastomers, epoxy, glycerin, and propylene glycol, among others.

Further, holder system 260 may also include a thermocouple, identified with the reference numeral 270.

In some exemplary aspects, strain measurements and related applications/adjustments thereof may also be performed on exemplary batteries. For instance, means for measuring strain or other processes for measuring changes in the thickness of a battery, such as a strain gauge, laser distance gauge, infra-red (IR) distance gauge, etc., may be used to measure strain at the transducer-battery interfaces and perform any desired adjustments accordingly. Accordingly, one or more slots identified with the reference numeral 274 are shown, wherein slots 274 may be configured to accommodate the strain gauges or other sensors of humidity, pressure, etc., or combinations thereof.

Although the means for applying pressure in holder systems 200, 220, 240, and 260 e.g., the springs discussed in FIGS. 2A-D may be suitable in some cases, it is possible for variations to exist between the different means for applying pressure which may be used. Although these variations may arise in any means for applying pressure, the case of springs will be discussed in further detail to illustrate some of the exemplary features which will be discussed in the following section. In the case of springs, variations may arise during their manufacture. Variations may also exist in spring constant, stiffness, etc., between different springs. These variations in characteristics of the springs may give rise to variations in the pressure applied by the spring, between the respective transducers and the battery to which the transducers are mechanically coupled to, wherein the pressure is referred to herein as "$P_{td}$". Furthermore, over the course of charge/discharge cycles of a battery, and with age, the volume of the battery may expand, which can lead to additional compression of springs used in applying pressure to the transducers, thus leading to potential changes in $P_{td}$ as well. EASI is understood to be dependent on $P_{td}$, which means that changes in $P_{td}$ such as the above-noted increase in $P_{td}$ can affect the measured acoustic signal. It is therefore desirable to maintain a constant pressure $P_{td}$ at the transducer-battery interface for the case of springs and more generally for the case of any device or means for applying pressure on the transducers. Accordingly, the following sections describe devices or means for adjusting the pressure applied by the devices or means for applying the pressure.

FIGS. 3A-D show several example holder systems configured for adjustable pressure $P_{td}$ at transducer-battery interfaces, e.g., for EASI. FIG. 3A illustrates an example holder system 300 similar to holder system 200 discussed in FIG. 2A, without additional arrangements configured for adjustable pressure $P_{td}$. In more detail, holder system 300 comprises battery 302, with arms 304a-b configured to hold transducers 308a-b mechanically coupled to battery 302, and with respective springs 306a-b configured to apply pressure on transducers 308a-b to facilitate the coupling.

FIG. 3B shows holder system 310 which comprises an enhancement to holder system 300 of FIG. 3A, wherein holder system 310 comprises one or more pressure adjusting devices, shown in this case as plates or slots 314 configured to couple transducers 308a-b to battery 302, wherein pressure may be adjusted using screws/bolts 312 (e.g., lead screws). In this implementation, the pressure adjusting device or means for adjusting pressure on the interface between battery 302 and transducers 308a-b is disposed at the interface. Pressure sensors (not shown) may be placed at the interface between battery 302 and each of transducers 308a-b, e.g., to measure $P_{td}$ at the time of assembly and then applying or maintaining the constant pressure at the transducer-battery interfaces.

As an alternative to the above-described plates 314 and screws/bolts 312 configured as means for adjusting pressure, it is also possible to use motorized linear actuators, linear stepper motors, motorized lead screw, or other computer-controlled actuators to apply adjustable pressure and use the pressure sensors as part of a feedback loop to ensure proper pressure levels are met and/or maintained. Such designs that utilize a pressure sensor, either with the manual lead screw or with the computer-controlled actuators, can also be used to monitor and maintain $P_{td}$ during the course of charge/discharge cycling of the battery.

FIG. 3C shows holder system 320 configured with another exemplary means for adjusting the pressure applied on the transducer-battery interfaces. In this case, the pressure of the means for applying pressure on transducers 308a-b, e.g., springs 306a-b, may be adjusted with means for adjusting the pressure such as screws/bolts 322a-b respectively, which may be provided within or in conjunction with corresponding arms 304a-b. In similar manner as discussed with reference to FIG. 3B, alternative means for adjusting pressure can include motorized linear actuators, linear stepper motors, motorized lead screw, or other computer-controlled actuators to apply adjustable pressure. Pressure sensors may once again be provided at the transducer-battery interfaces or alternatively, may be provided at the interfaces between screws 322a-b and respective transducers 308a-b, wherein the pressure sensors may be used as part of a feedback loop to ensure proper pressure levels are met and/or maintained at the transducer-battery interfaces.

FIG. 3D shows another exemplary holder system 330, wherein the means for applying pressure and the means for adjusting the pressure may be combined into the same mechanism. In this case, springs 306a-b shown in FIGS. 3A-C are omitted and screws 332a-b are shown as being configured to directly apply and adjust pressure on transducers 308a-b. As previously mentioned, alternative mechanisms may be used instead of or in conjunction with screws 332a-b for the purposes of applying and maintaining constant pressure on battery 302 over the course of various measurements for EASI-based analysis.

Figure 3E:
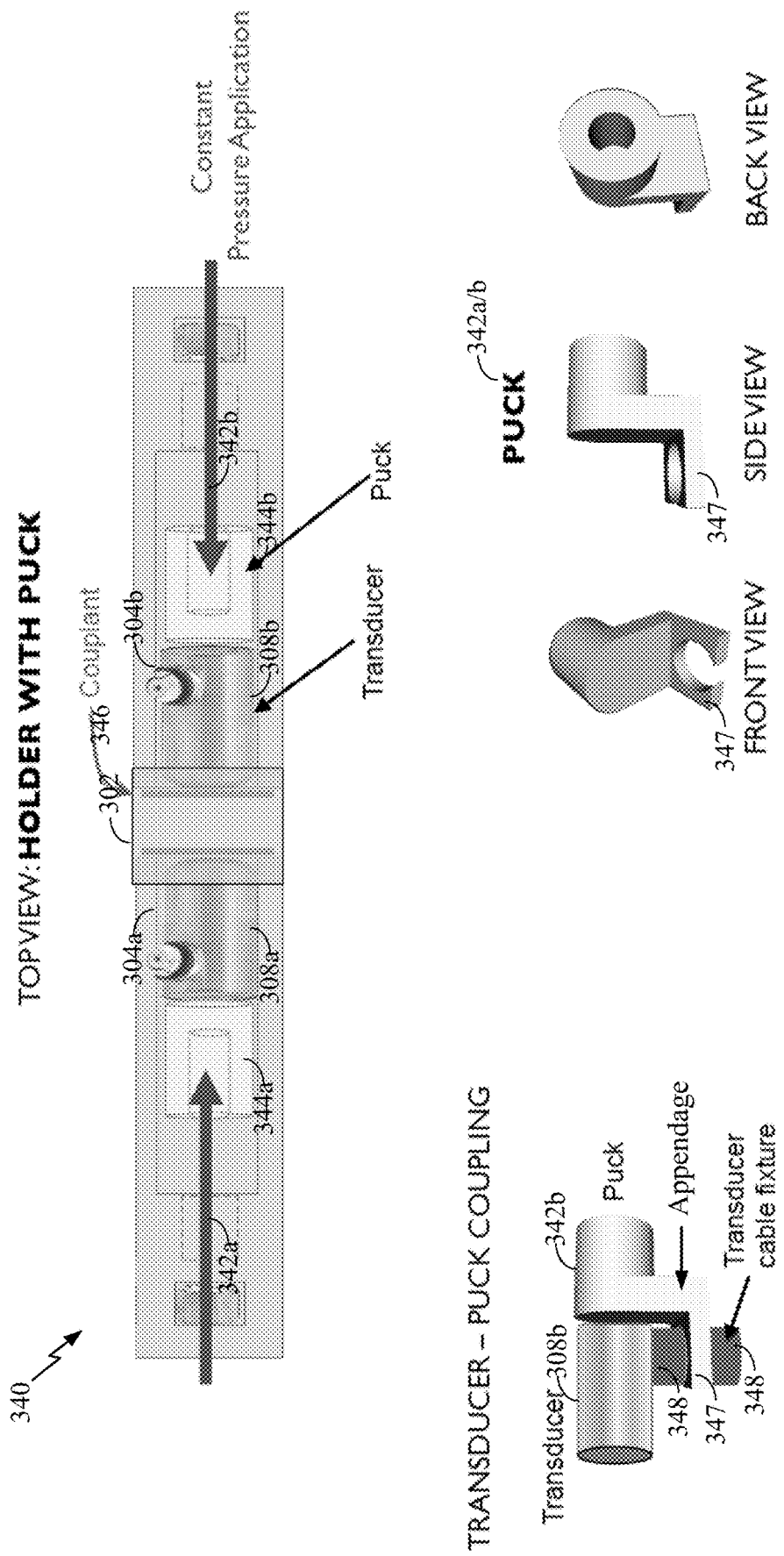

FIG. 3E shows another exemplary holder system 340, wherein a puck is placed between the means for adjusting or applying pressure (or pressure actuation mechanism) and the back of a respective transducer. For instance, pucks 344a-b are placed between any means for actuation or means for applying/adjusting pressure 342a-b and respective backs of transducers 308a-b. Couplants 346 are shown between faces or fronts of transducers 308a-b and battery 302 as an optional feature for holder system 340.

Pucks 344a-b are configured to maintain contact with the flat back surfaces of the respective transducers 308a-b, thus distributing the pressure applied across the faces of transducers 308a-b. Various views including front, side, and back views of an example puck 342a/b have been illustrated. As seen from the back view, puck 342a/b has a slot in the back to accommodate a piston or spring or "arm" of the pressure actuator or respective means for applying/adjusting pressure 342a/b. Additionally, puck 342a/b may nominally be of the same radial dimensions as the respective transducer 308a/b and slide in a transducer holder groove smoothly. As shown in the expanded view, puck 342a/b may have appendage 347 (e.g., comprising a ring or circular clamp as seen in the front and side views of puck 342a/b) configured to fit around cable fixture 348 attached to the respective transducer 308a/b. Puck 342a/b may also be designed to nestle or house at least a back portion of the respective transducer 308a/b within it. In the above-described aspects, pucks 344a-b may improve alignment of respective transducers 308a-b with battery 342 and also for improved repeatability/consistency of the acoustic signals transmitted/received by respective transducers 308a-b.

In some aspects, maintaining a constant stack pressure on the battery which is invariant with the initial thickness of the battery or any changes in battery thickness during charge/ discharge cycling, exemplary holder systems are disclosed herein which may be gravity-assisted.

Figure 4:
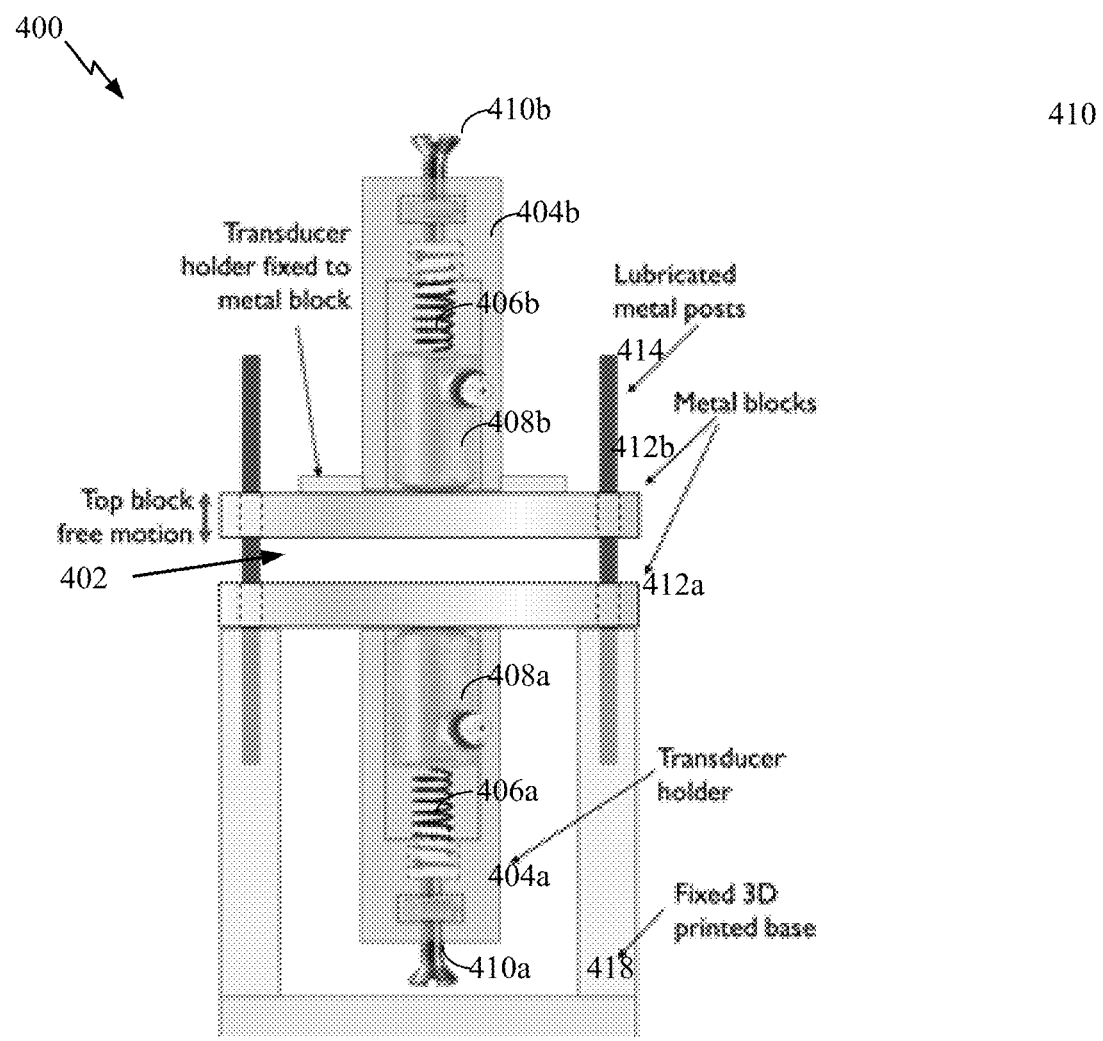
FIG. 4 illustrates an example holder system with a gravity-assisted mechanism for applying pressure between transducers and batteries under test, according to aspects of this disclosure.

With reference to FIG. 4, another gravity-assisted holder system 400 is shown, wherein battery 402 is placed onto a platform, wherein the platform may comprise a fixed base 418 (e.g., constructed with a 3D printer in a low-cost and flexible implementation) with a top surface formed by a metal block or metal plate 412a, for example. The slot where battery 402 may be placed on top of metal plate 412a has been shown.

Depending on the type of battery or geometry of the battery, another metal block or metal plate 412b may be configured to make contact with the battery on a surface different from, or more specifically, opposite to that of metal plate 412a. In this case, in a side-view as illustrated, with the platform comprising fixed base 418 and metal plate 412a on the bottom side of battery 402, metal plate 412b may be configured to make contact with the top side of battery 402. Further, metal plate 412b may be moveable, by means of lubricated metal posts 414 passing through pre-made holes in metal plate 412b (or alternatively, other means for providing free motion to metal blocks 412b such as rails, rods, tracks, etc.). Corresponding holes may also be made in metal plate 412a and fixed base 418 to accommodate any remaining length of metal posts 414. Alternatively, bottom and top metal plates 414a-b may have grooves machine-cut to fit any geometry of battery 402, including rectangular slots for pouch and prismatic cells and semicircular segments for cylindrical cells. By this arrangement, metal plate 412b may be configured to provide a constant pressure on battery 402, assisted by gravity.

Although additional means for applying pressure may be dispensed with, in the illustrated implementation, arms 404a-b are shown to be attached to or mechanically coupled to metal plates 414a-b respectively, with arms 404a-b respectively comprising transducers 408a-b and additional means for applying pressure such as springs 406a-b. In combination, holder system 400 may be configured to electrically and/or mechanically couple transducers 408a-b for transmitting/receiving acoustic signals into/from battery 402 for EASI of battery 402.

Although metal plates 412a-b or metal blocks have been discussed above, any means for applying a constant mass on top of a battery situated on a fixed base or platform may be used instead. In the illustrated example of holder system 400, metal block 412b, to which transducer 408b is affixed, may be configured to move freely along metal posts 414. With this configuration, as battery 402 goes through charge/discharge cycles, for example, corresponding, the constant mass comprising arm 404b may move along metal posts 414 and a constant applied pressure may be maintained on the transducer-battery interfaces in this manner.

Additionally, pressure sensors can be placed between transducers 408a-b and respective metal plates 412a-b and means for adjusting pressure such as screws 410a-b are also illustrated aspect. As alternative means for adjusting pressure, computer-controlled actuators, pneumatic or electromagnetic solenoids, linear or other types of mechanical actuators, etc., may be used to apply a constant $P_{td}$ on metal plates 412a-b. By utilizing a strain gauge or other means for measuring changes in the thickness of battery 402, an additional measurement of the precise battery thickness during charge/discharge cycling, for example, can be obtained. This thickness measurement can be automated in various ways, for example with displacement sensors placed along posts 414 and connected to a computer.

Exemplary holder systems discussed herein may be of a modular design. For example, the aspects of the holders used to house the transducer units (referred to as "arms" above), and the aspects of the holders which accommodate the battery (or "battery holders") can be independent from each other, or can be coupled as needed. The aspects of the holders for accommodating the battery can comprise flexible units (e.g., 3D printed), metal, or plastic jackets with identical and in some instances, coaxial slots to expose the body or surface of the battery to the transducers. In some aspects, the slots need not be coaxial and may support arrangements of transducers wherein off-axis transducer measurements may be performed.

The arms may have a fixture that fits onto the battery holders such that the transducers sit precisely on the surface of the battery through the slots on the battery holder.

Further, the battery holder can also be designed to accommodate holders (e.g., 3D-printed) for strain gauges or other sensors of humidity, chemical species, etc., as well as for components such as thermocouples, or pressure sensors, or for any combination of sensors.

The battery holders and sensor holders may also have universal fixtures that enable the various sensor holders to be precisely affixed to the battery holder. The universal fixtures enable measurements on the body of the batteries to be taken through slots in the battery holder. The sensor holders can be pre-loaded and attached to the battery holders prior to placing the batteries within the battery holders according to disclosed aspects.

The above-described modular designs for holder systems may be configured for collecting long term charge/discharge cycling data as well as for measuring temperature, pressure, and internal structure of the batteries through acoustic signal based analyses such as EASI. The exemplary modular holder systems may also be advantageously configured for quick, short-term measurements of open circuit voltage, temperature, internal pressure, and internal structure using EASI. The measurement of multiple physical parameters in one "snapshot" allows battery tests to be performed, for example, to check whether all parameters are within tolerance levels and ready for use.

The exemplary holder designs described above may be configured for manual setup/loading of individual batteries and where applicable, sensors, into the holder systems. However, manual loading can cause user-related inefficiencies and errors. If the EASI is performed on a battery manufacturing line, for example, high throughput operation may be achieved by automating the loading and setup processes. In such automated deployments, for example, the sensor holders may be more advantageously designed into a battery holder in advance, and the battery holders may be designed into automated actuator arms or units that can be efficiently and rapidly placed onto each battery under test for high-throughput measurements. The battery holders can be attached to mechanical arms which have motion and pressure sensors to detect the presence of a battery in its path and automatically close or lock in place the battery holder and complete the measurements. Such implementations of automated battery alignment with battery holders may be used to ensure that the pressure applied by the transducers (for EASI) and strain gauge or other techniques for measuring battery thickness, for example, are accurate as related settings can be programmed into the automated mechanical arms.

Figure 5:
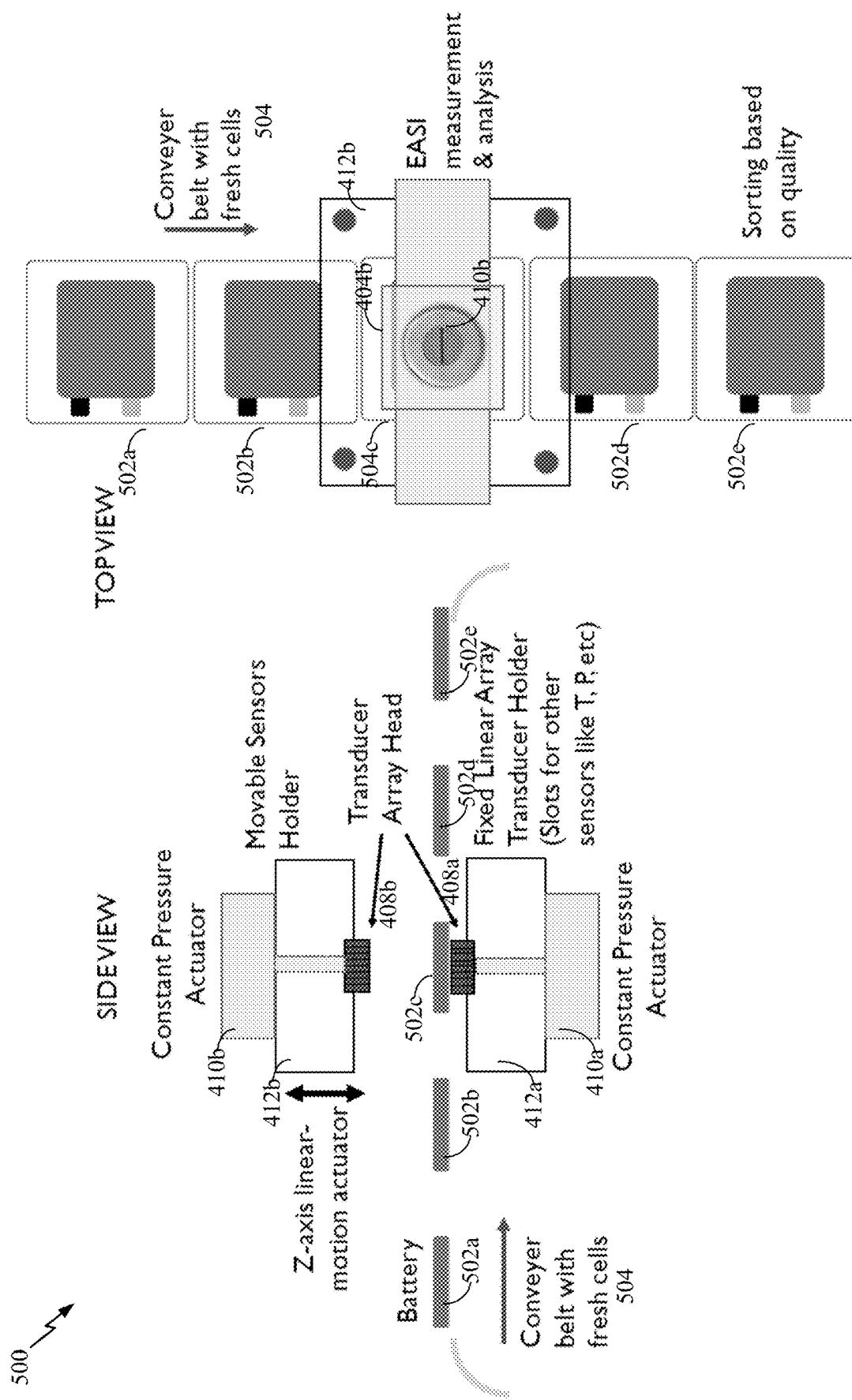
FIG. 5 illustrates an example automation process for battery testing, according to aspects of this disclosure.

FIG. 5 illustrates representative aspects of an exemplary automated holder system. More specifically, a side view and a top view a holder such as holder 400 of FIG. 4 are shown.

The side view illustrates constant pressure actuators or means for adjusting pressure such as screws 410a-b, transducer holders such as metal plates 412a-b (with movable holder or top metal plate 412b and fixed holder or bottom metal plate 412a) comprising slots for sensors, as well as transducers 408a-b (which may include arrays of transducers in some aspects). The top view illustrates top metal plate 412b, arm 404b, and screw 410b. In an example implementation, the illustrated top portions of holder system 400 (e.g., arm 404b and metal plate 412b) may be moveable, e.g., using an automated system configured to raise and lower these top portions to mechanically couple related transducers to each battery as it passes through holder system 400. Various batteries 502a, b, c, d, e are shown, with battery 502c is precisely aligned under the top portion of holder system 400. The batteries 502a-e may be placed on conveyor belt 504, e.g., akin to a production line, and as conveyor belt 504 passes the batteries 502a-e through the sensor unit, physical measurements can be quickly taken.

Exemplary automated measurement systems such as the one depicted in FIG. 5 can be incorporated into a systems for quality control/quality assurance, wherein the outputs of the measurement sensors may be fed into an algorithm used for grading/rating the quality of the batteries tested and to sort or bin the batteries accordingly.

In conventional designs for battery testing, separate platform designs may be required for different geometries such as rectangular, cylindrical, etc. However, exemplary holder systems may be configured as universal holder systems in the sense that they may adapt to or accommodate any geometry or shape of the batteries under test. In some aspects, the exemplary universal holder systems may incorporate mechanical actuation into the battery holder for securing and positioning the battery under test. For example, one or more optical or haptic or other type of proximity sensors may be used to gauge the shape and location of a battery within the battery holder during placement of the battery into the battery holder. Further, computer-controlled mechanisms may then be used to actuate mechanical parts to properly place, align, and secure the battery for measurement. A similar type of sensor holder with universal fixtures, as described herein, may also be used to enable modular sensor designs.

In some aspects, a fluid couplant such as polymer gel, silicone oil, glycerin, propylene glycol, or combinations thereof may be used to ensure proper mechanical coupling between the acoustic transducers and objects they may be used to test, e.g., the batteries in above-described aspects. The fluid couplant may create or improve mechanical contact. However, in some instances, the fluid couplant may flow or drain away from the interface between the transducer (or arm holding the transducer (and battery under test, so the fluid couplant may not last for multiple measurements. The fluid couplant may be particularly short-lived or unsuitable in high throughput environments like a battery production line.

Accordingly, in some aspects of this disclosure, a non-fluid couplant may be used instead, wherein the non-fluid couplant may be applied to the transducer (or arm holding the transducer). The non-fluid couplant applied in this manner may reliably improve mechanical contact between the transducer and the battery under test for multiple measurements without causing damage to the battery or leaving any residue behind.

Figure 6:
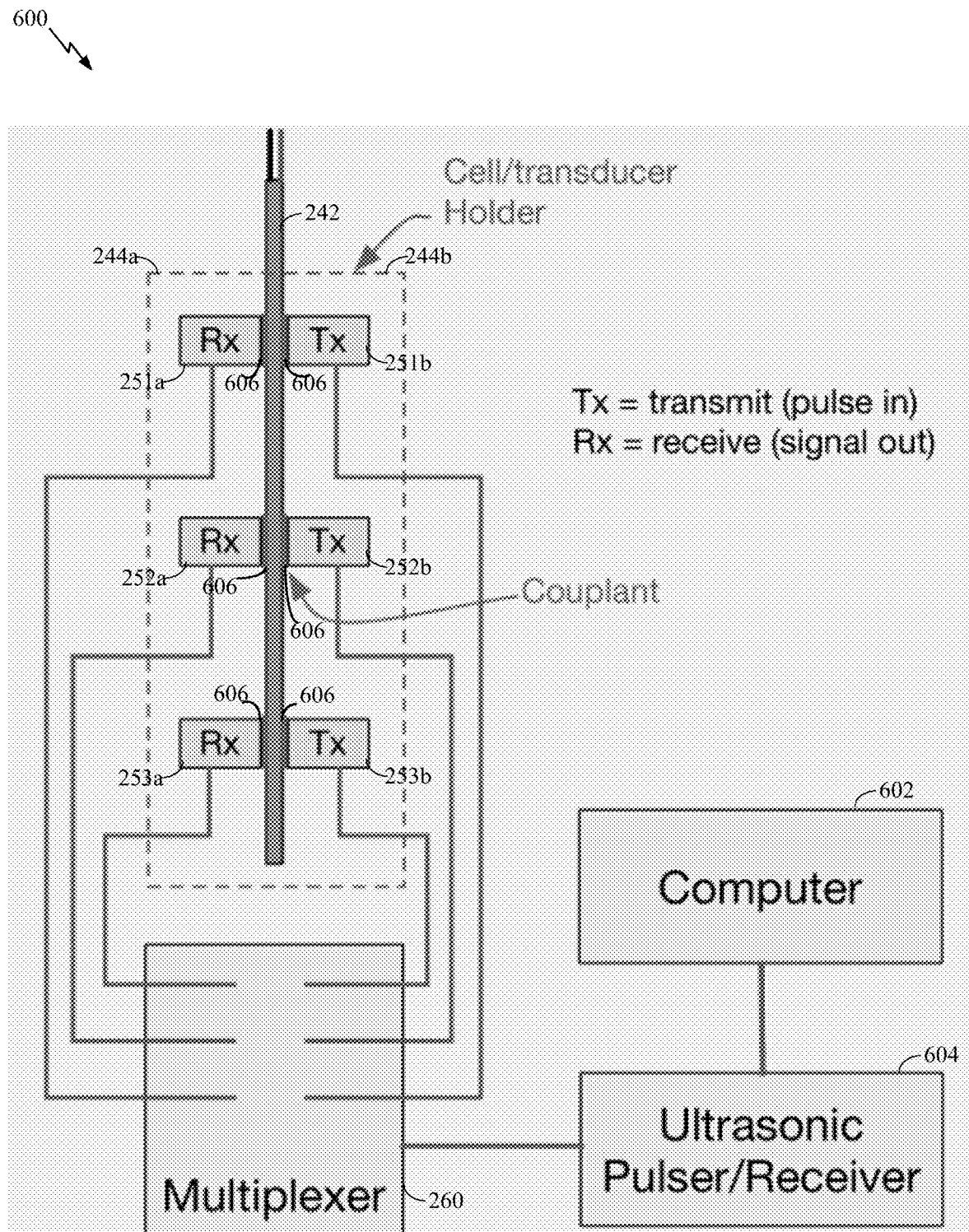
FIG. 6 illustrates example aspects of couplants used in improving mechanical contact between transducers and batteries, according to example aspects of this disclosure.

With reference now to FIG. 6, holder system 600 is shown, which comprises several features of holder system 240 described previously with reference to FIG. 2C and an exhaustive repetition of like-numbered components will be avoided. Briefly, as seen, FIG. 6 shows a schematic view of a circuit with transducers 251a, 252a, and 253a of arm 244a configured, for example, to transmit acoustic signals and transducers 251b, 252b, and 253b of arm 244b configured, for example, to receive the transmitted acoustic signals (keeping in mind that each one of transducers 251b, 252b, and 253b may be configured to receive acoustic signals transmitted from any one or more transducers 251a, 252a, and 253a). Wires or interconnects from transducers 251a-b, 252a-b, and 253a-b may be electrically coupled to multiplexor 260. Ultrasonic pulser/receiver 604 may be configured to transmit signals to multiplexor 260 for proper routing to the appropriate transducers 251a, 252a, and 253a for transmission and correspondingly, multiplexor 260 may route the received signals from transducers 251b, 252b, and 253b back to ultrasonic pulser/receiver 604 for further analysis (wherein, it will be understood that in some implementations, the pulser and receiver portions of ultrasonic pulser/receiver 604 may be contained within a single unit, while in other implementations, the pulser and receiver portions may be separately housed and/or separately controlled). Computer 602 coupled to ultrasonic pulser/receiver 604 may aid in the analysis, e.g., by performing calculations pertaining to EASI of battery 242.

Also shown in FIG. 6 are couplants between transducers 251a-b, 252a-b, 253a-b and battery 242. Couplants between respective transducers and the body of battery 242 have been identified with the reference numeral 606. Couplants 606 may be fluid or non-fluid couplants. In one aspect, couplants 606 may be configured as non-fluid or dry couplants as discussed above and applied at the respective interfaces shown for maintaining good mechanical contact between the respective transducers and the body of battery 242 over numerous tests. Dry couplants such as couplants 606 may be applied in the shape of a boot or cover to respective transducers (or arms housing the transducers) or other sensors. Several types of dry couplants may be utilized for forming couplants 606, including, for example, silicone rubber, elastomers, waxes, cyanoacrylates, epoxies, etc. These dry couplants may be applied onto the transducers (e.g., in the shape of a boot or cover) and fixed to the battery holder, e.g., to arms 244a-b. The battery holder can also be designed with a mechanical ultrasound couplant transducer boot in some instances.

In exemplary aspects, it is recognized that the transducers provided in example holder systems may not be acoustic point sources, but rather, may have finite diameters, wherein the acoustic waves transmitted by a transducer, for example, may emanate from the entire surface of the transducer (e.g., implemented as a piezoelectric transducer (PZT) or Polyvinilidene fluoride (PVDF) transducer, etc.). A transducer whose face is a planar round shape is observed to emit a sound field that resembles a cylindrical mass in front of the transducer. As the acoustic wave originates from a number of points along the transducer's face, the intensity of the ultrasound signal emitted, along the beam is affected by constructive and destructive wave interference, also known as diffraction. These types of interferences may lead to extensive fluctuations in the intensity of the ultrasound signal near the source, i.e., the transducer, which is referred to as a "near field" of the transducer. Because of acoustic variations within the near field, accurate evaluation of flaws in materials (e.g., batteries) when they are positioned within the near field is challenging.

The area beyond the near field, wherein the ultrasonic wave is more uniform is referred to as a "far field" of the transducer. In the far field, the ultrasonic wave is observed to spread out in a pattern originating from the center of the face of the transducer. The transition between the near field and the far field occurs at a distance, N, and is sometimes referred to as a "natural focus" of a flat (or unfocused) transducer. The near/far field distance, N, is significant because amplitude variations that characterize the near field change to a smoothly-declining amplitude at the point of transition. An area immediately beyond the near field, with respect to the transducer, is observed to be the area wherein the ultrasonic wave is well-behaved and at its maximum strength. Therefore, optimal detection results may be obtained when the sample or battery test is placed at a distance slightly beyond distance N from the face of the transducer. In exemplary aspects, a waveguide may be deployed to position the sample or the battery just beyond the "near field" of the transducer.

Figure 7:
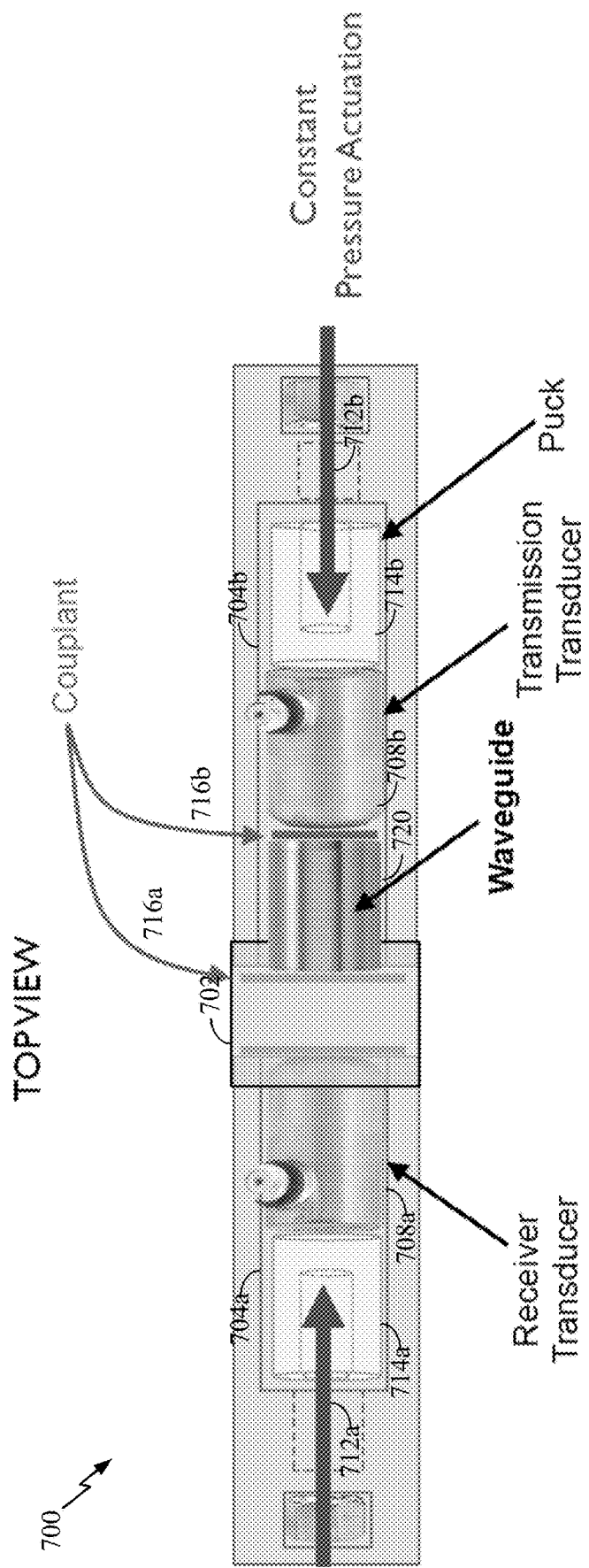
FIG. 7 illustrates aspects of a waveguide configured to position the battery at a distance beyond a near field of a transducer, according to example aspects of this disclosure.

With reference to FIG. 7, a top view of holder system 700 is shown with battery 702 and arms 704a-b comprising transducers 708a-b for EASI measurements, pucks 714a-b (as described with reference to FIG. 3E), and means for applying/adjusting pressure 712a-b, respectively. In an example, transducer 708b may be configured as a transmission transducer for emitting ultrasonic waves and transducer 708a may be configured as a receiver transducer. Also shown is waveguide 720, disposed between transducer 708b and battery 702, configured to position battery 702 beyond the near field of transducer 708b. The distance N where waveguide 720 causes battery 702 to be positioned with respect to transducer 708b may be calculated as follows: $N=D^2 f/4c$, wherein D is a diameter of transducer 708b, $f$ is a frequency of the acoustic or ultrasonic wave transmitted by transducer 708b, and $c$ is the speed of sound in the medium or material of waveguide 720.

Waveguide 720 may be implemented as a cylinder or block of length N and diameter D and of a known material (wherein, c is the speed of sound in the known material) and placed in front of the transmitting transducer 708b of frequency $f$, to position battery 702 just beyond the "near field" of transducer 708b. Implementations wherein the waveguide is made of a material with very low attenuation are seen to be advantageous in exemplary aspects. Additionally, couplants (as discussed with reference to FIG. 2D, 6) may be used to improve the mechanical contact between the various components of holder system 700. For example, couplant 716a may be disposed between waveguide 720 and battery 702 and 716b between transducer 708b and waveguide 720 as shown.

Waveguide 720 may be included as a part of holder system 700 according to FIG. 7 to improve the quality of the acoustic signals that enter battery 702, and are received at the receiver transducer 708a on the other side of battery 702. With the use of waveguide 720, the "near field" fluctuations in the acoustic wave can be avoided or minimized and the acoustic measurement reliability may be correspondingly improved.

Figure 8:
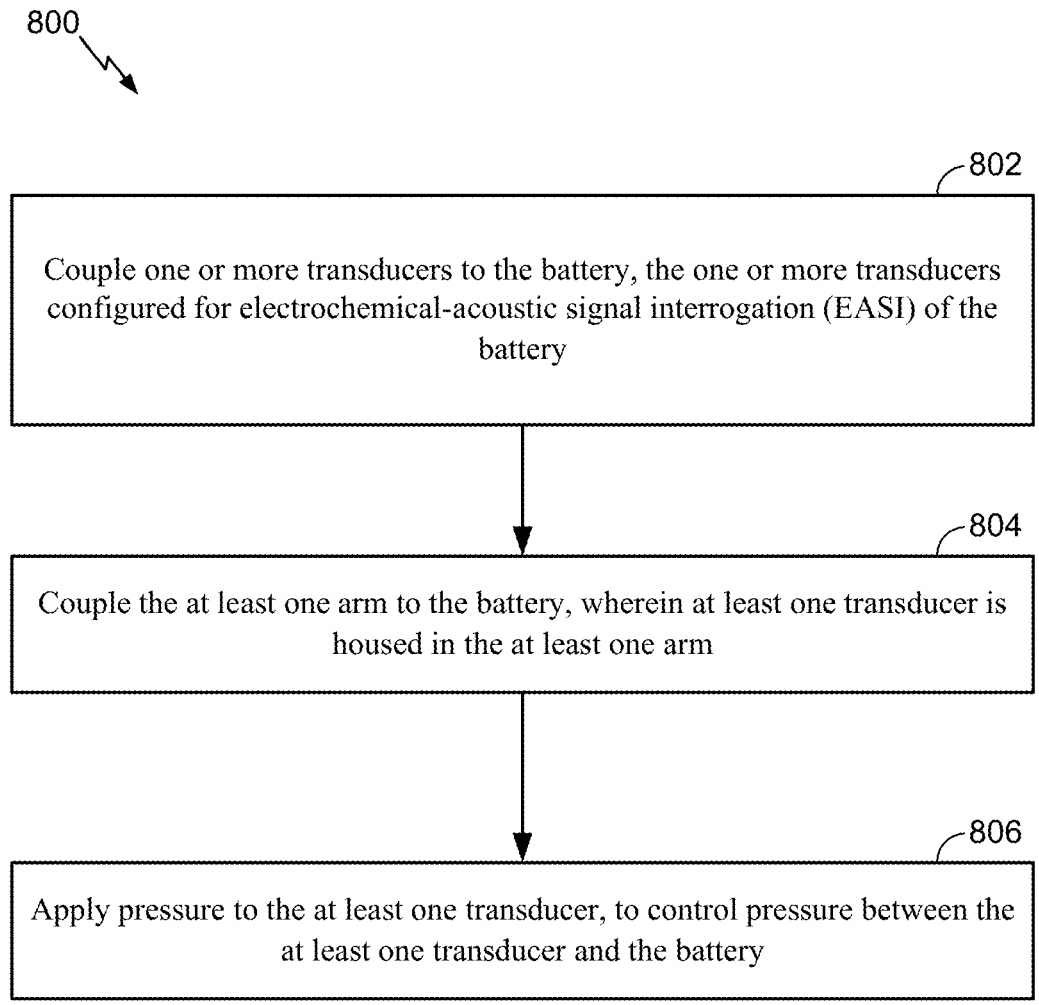
FIG. 8 illustrates a method of testing a battery using a holder system, according to example aspects of this disclosure.

It will be appreciated that aspects include various methods for performing the processes, functions and/or algorithms disclosed herein. For example, FIG. 8 illustrates an exemplary method 800 of testing a battery (e.g., battery 202 of FIG. 2A).

Block 802 comprises coupling one or more transducers to the battery (e.g., transducers 208a-b), the one or more transducers configured for electrochemical-acoustic signal interrogation (EASI) of the battery.

Block 84 comprises coupling the at least one arm to the battery, wherein at least one transducer is housed in the at least one arm (e.g., arms 204a-b)

Block 806 comprises applying pressure (e.g., using pressure applying devices such as springs 206a-b) to the at least one transducer, to control pressure between the at least one transducer and the battery.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium.

Accordingly, an aspect of the invention can include a computer-readable media embodying a method for analyzing a battery using transducers coupled to the battery, for transmitting/receiving acoustic signals. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. An apparatus comprising:
   a holder system configured to couple one or more transducers to a battery, the one or more transducers configured for electrochemical-acoustic signal interrogation (EASI) of the battery, the holder system comprising:

at least one arm configured to house at least one transducer to be coupled to the battery;
a pressure applying device configured to apply pressure to the at least one transducer, to control pressure between the at least one transducer and the battery; and
a waveguide disposed between the battery and the at least one transducer.

2. The apparatus of claim 1, wherein the at least one transducer is one of a transmitter or receiver of acoustic signals.

3. The apparatus of claim 2 further comprising an ultrasonic pulser and receiver, configured to transmit an acoustic pulse through a first transducer configured to transmit acoustic signals and receive the transmitted pulse through a second transducer configured to receive acoustic signals.

4. The apparatus of claim 3 wherein the first transducer is housed in a first arm and the second transducer is housed in a second arm, wherein the first arm and the second arm are independently moveable, and wherein the first arm and the second arm are disposed to be one of: coaxial or off-axis with respect to each other.

5. The apparatus of claim 3 wherein the first transducer and the second transducer are housed in a first arm.

6. The apparatus of claim 1, wherein the pressure applying device comprises one or more of springs, pneumatic pressure mechanisms, lead screws, linear actuators, or electromagnetic solenoids.

7. The apparatus of claim 1, further comprising a pressure adjusting device configured to adjust the pressure applied by the pressure applying device.

8. The apparatus of claim 7, wherein the pressure adjusting device comprises one or more of:
a screw and bolt assembly disposed at an interface between the at least one transducer and the battery; or
a screw disposed at an outer side of the at least one transducer, the outer side opposite to the interface between the at least one transducer and the battery.

9. The apparatus of claim 7, further comprising at least one pressure sensor configured to determine pressure between the at least one transducer and the battery, wherein the pressure adjusting device comprises one or more motorized linear actuators, linear stepper motors, motorized lead screws, computer-controlled actuators configured to apply adjustable pressure based on feedback from the at least one pressure sensor, computer-controlled pneumatic valves, computer-controlled pistons, or computer-controlled solenoids.

10. The apparatus of claim 1, further comprising a strain gauge configured to determine strain at an interface between the at least one transducer and the battery.

11. The apparatus of claim 1, wherein the pressure applying device comprises a gravity-assisted device comprising a fixed platform and a moveable platform, the moveable platform configured to apply pressure based on gravity, with the at least one arm coupled to the moveable platform.

12. The apparatus of claim 1, wherein the battery comprises cells of one or more geometries including a pouch cell or a cylindrical cell.

13. The apparatus of claim 1, wherein the holder system further comprises one or more of a slot to accommodate the battery, a slot to accommodate the battery, or one or more slots to accommodate one or more sensors.

14. The apparatus of claim 1, further comprising a device for automatic, robotic, or computer-controlled placement of the arm with respect to the battery for precise alignment of the at least one transducer.

15. The apparatus of claim 14, wherein the device comprises a conveyor belt configured to bring two or more batteries into contact with the at least one arm in a stepwise manner during a process of testing the two or more batteries.

16. The apparatus of claim 1, further comprising a non-fluid couplant applied to the at least one transducer to improve mechanical contact between the at least one transducer and the battery.

17. The apparatus of claim 1, further comprising a puck configured to maintain contact with a back surface of the at least one transducer and to distribute pressure at an interface between the at least one transducer and the battery.

18. The apparatus of claim 17, wherein the puck comprises a slot to accommodate a piston of the pressure applying device.

19. The apparatus of claim 17, wherein the puck is configured to house at least a back portion of the at least one transducer or wherein the puck comprises an appendage configured to fit around a cable fixture attached to the at least one transducer.

20. The apparatus of claim 1, wherein the waveguide is configured to position the battery beyond a near field of the at least one transducer.

21. The apparatus of claim 20, wherein the waveguide is a cylinder or block of length N and a diameter of the at least one transducer is D, with a speed of sound through the waveguide is c, and the at least one transducer is configured to transmit acoustic signals at a frequency $f$, and wherein $N=D^2 f/4c$.

22. A method of testing a battery, the method comprising:
coupling one or more transducers to the battery, the one or more transducers configured for electrochemical-acoustic signal interrogation (EASI) of the battery;
coupling the at least one arm to the battery, wherein at least one transducer is housed in the at least one arm;
applying pressure to the at least one transducer, to control pressure between the at least one transducer and the battery; and
disposing a waveguide between the battery and the at least one transducer.

23. The method of claim 22, further comprising determining the pressure between the at least one transducer and the battery and adjusting the pressure applied to the at least one transducer based on the determined pressure.

24. The method of claim 22, further comprising precisely aligning the arm with respect to the battery based on automatic, robotic, or computer-controlled mechanisms.

25. The method of claim 24, comprising placing two or more batteries on a conveyor belt and bringing the two or more batteries into contact with the at least one arm in a stepwise manner.

26. The method of claim 22, further comprising applying a couplant to the at least one transducer to improve mechanical contact between the at least one transducer and the battery.

27. The method of claim 22, further distributing pressure at an interface between the at least one transducer and the battery based on configuring a puck in contact with a back surface of the at least one transducer.

28. The method of claim 22, wherein disposing the waveguide between the battery and the at least one transducer includes positioning the battery beyond a near field of the at least one transducer.

29. A battery holder system comprising:
  means for housing at least one transducer to be coupled to a battery under test, the at least one transducers configured for electrochemical-acoustic signal interrogation (EASI) of the battery;
  means for applying pressure to the at least one transducer for controlling pressure between the at least one transducer and the battery; and
  means for positioning the battery beyond a near field of the at least one transducer.

30. The battery holder system of claim 29, further comprising means for determining the pressure between the at least one transducer and the battery and means for adjusting the pressure applied to the at least one transducer based on the determined pressure.

31. An apparatus comprising:
  a holder system configured to couple one or more transducers to a battery, the one or more transducers configured for electrochemical-acoustic signal interrogation (EASI) of the battery, the holder system comprising:
    at least a first arm configured to house at least a first transducer configured to transmit an acoustic pulse and a second arm configured to house at least a second transducer configured to receive the transmitted pulse, the first transducer and the second transducer to be coupled to the battery, wherein the first arm and the second arm are independently moveable; and
    a pressure applying device configured to apply pressure to the at least one transducer, to control pressure between the at least one transducer and the battery.

32. The apparatus of claim 31, wherein the first arm and the second arm are disposed to be one of: coaxial or off-axis with respect to each other.

* * * * *